United States Patent [19]
Su et al.

[11] Patent Number: 6,133,096
[45] Date of Patent: Oct. 17, 2000

[54] PROCESS FOR SIMULTANEOUSLY FABRICATING A STACK GATE FLASH MEMORY CELL AND SALICIDED PERIPHERERAL DEVICES

[76] Inventors: Hung-Der Su; Jong Chen; Chrong-Jung Lin; Di-Son Kuo, all of No. 9 Creation Rd. 1, Science-Based Industrial Park, Hsin-Chu, Taiwan

[21] Appl. No.: 09/208,917

[22] Filed: Dec. 10, 1998

[51] Int. Cl.$^7$ ................................................ H01L 21/336
[52] U.S. Cl. ....................... 438/264; 438/264; 438/257; 438/303; 438/622; 438/629; 438/634
[58] Field of Search .................... 438/264, 257, 438/303, 622, 629, 634, 656

[56] References Cited

U.S. PATENT DOCUMENTS

| | | | |
|---|---|---|---|
| 5,439,846 | 8/1995 | Nguyen et al. | 437/187 |
| 5,623,442 | 4/1997 | Gotou et al. | 365/185 |
| 5,631,179 | 5/1997 | Sung et al. | 438/264 |
| 5,652,161 | 7/1997 | Ahn | 437/43 |
| 5,907,781 | 5/1999 | Chen et al. | 438/264 |
| 6,037,223 | 3/2000 | Su et al. | 438/257 |

*Primary Examiner*—David Nelms
*Assistant Examiner*—Phuc T. Dang
*Attorney, Agent, or Firm*—George O. Saile; Stephen B. Ackerman

[57] ABSTRACT

A process for integrating the fabrication of a flash memory cell, on a first region of a semiconductor substrate, with the fabrication of salicided peripheral devices, on a second region of the semiconductor substrate, has been developed. The flash memory cell features SAC contact structures, located between stacked gate structures, contacting underlying source/drain regions. The stack gate structures are comprised of a polycide control gate shape, on a dielectric layer, overlying a polysilicon floating gate shape. The performance of the peripheral devices are increased via use of metal silicide layers, located on the top surface of a polysilicon gate structure, as well as on the adjacent heavily doped source/drain regions.

29 Claims, 15 Drawing Sheets

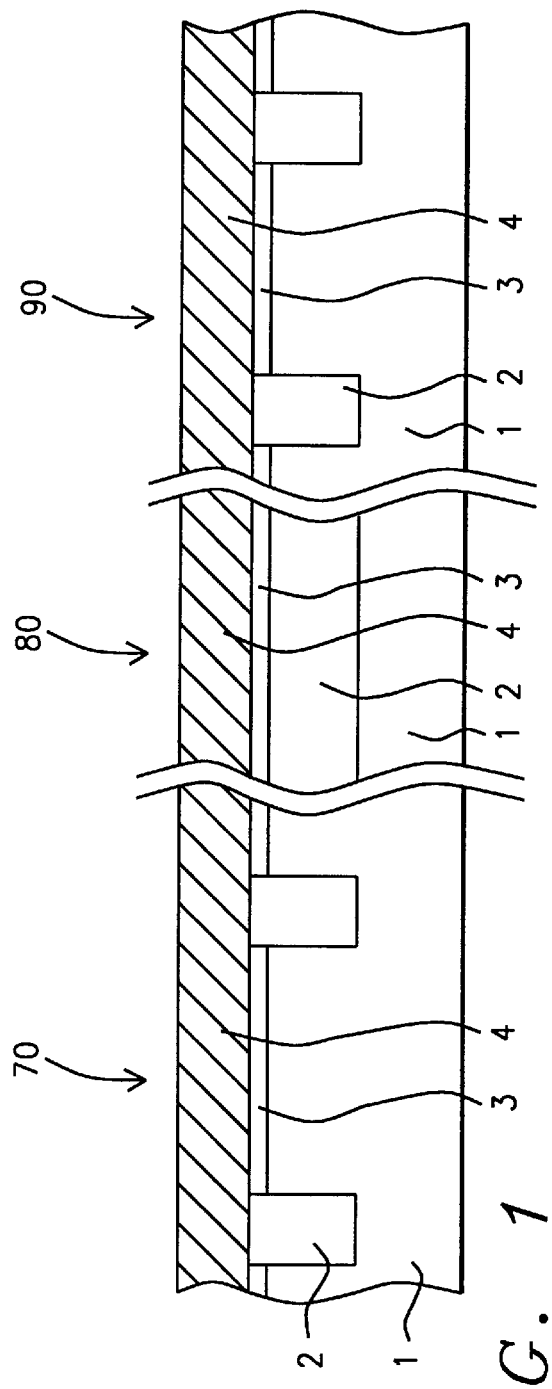
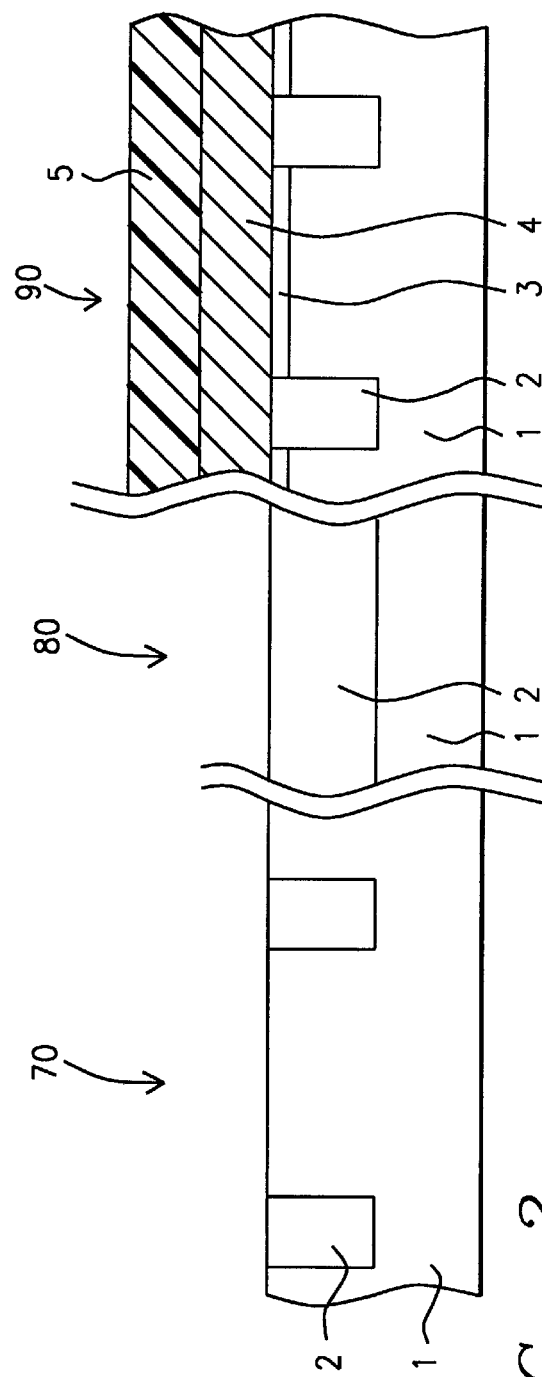
FIG. 1
FIG. 2

PROCESS FOR SIMULTANEOUSLY FABRICATING A STACK GATE FLASH MEMORY CELL AND SALICIDED PERIPHERERAL DEVICES

Related Patent Activity—"A NOVEL STACK GATE FLASH MEMORY CELL FEATURING SYMMETRIC SELF ALIGNED CONTACT STRUCTURES", H. D. Su, C. J. Lin, J. Chen, D. S. Kuo, of Taiwan Semiconductor Manufacturing Corporation, invention disclosure # TSMC98-171, assigned to a common assignee.

BACKGROUND OF THE INVENTION

(1) Field of the Invention

The present invention relates to processes used to fabricate semiconductor devices, and more specifically to a process used to simultaneously fabricate a flash memory cell, and peripheral devices.

(2) Description of the Prior Art

The use of flash memory devices allow data to be stored in a non-volatile mode, and allows the stored data to be erased and rewritten as desired. The term flash refers to the ability to erase numerous memory cells simultaneously. However, if more aggressive processes and designs, including the integration of high performing peripheral devices, resulting in smaller cell areas, with increased performance, are not implemented, performance and cost objectives, for flash memory chips, will be difficult to achieve.

This invention will teach a process for creating a self-aligned contact, (SAC), structure, for flash memory cells, resulting in a reduction in cell area, while also teaching a fabrication sequence that easily allows the integration of high performing peripheral devices. The use of the SAC structure removes the need of providing contact holes to source regions, thus saving a photolithographic procedure. In addition the use of the symmetric SAC structure design, used in this invention, will be more conducive to future micro-miniaturization trends, than counterpart flash memory cells, fabricating using conventional contacts to source/drain regions. In addition this invention will teach an integrated process sequence that easily allows the fabrication of salicided, peripheral devices, with the flash memory cells, thus resulting in performance improvements, when compared to counterparts fabricated without the integration of the salicide peripheral devices. Prior art, such as Sung et al, in U.S. Pat. No. 5,631,179, and Ahn, in U.S. Pat. No. 5,652,161, describe processes for fabricating flash memory cells, but neither prior art describe the novel integrated process sequence, used in the present invention, which allows high performing, peripheral devices, to be fabricated in the same process sequence used to create the devices for the flash memory cell.

SUMMARY OF THE INVENTION

It is an object of this invention to develop an integrated process sequence that allows the fabrication of elements of a flash memory cell, using stack gate structures, with the fabrication of high performance peripheral devices, comprised with salicided gate, and source/drain regions.

It is another object of this invention to simultaneously create SAC openings for the flash memory cell, and to create contact openings, to salicided regions of the peripheral devices, using a single photolithographic and etching procedure.

It is still another object of this invention to use the same process sequence to create the SAC structures, and word line contact structures, for the flash memory cell, while creating conductive plug structures for the salicided peripheral devices.

In accordance with the present invention an integrated process sequence is described that allows the simultaneous creation of a both flash memory cell, featuring SAC structures, and peripheral devices, using metal silicide on the gate and source/drain regions. After formation of isolation regions, in the semiconductor substrate, a gate insulator layer and an overlying intrinsic polysilicon layer, are formed, and left remaining, on a first region of the semiconductor substrate, to be used for the peripheral devices. After formation of a tunnel oxide layer, on a second region of the semiconductor substrate, to be used for the flash memory cell, an overlying polysilicon floating gate shape is formed. Stacked gate structures are next formed on the tunnel oxide layer, in a region to be used for the flash memory cell, with the stacked gate structures comprised of an overlying ONO, (Oxidized silicon nitride on silicon Oxide), capping layer, a polycide, (tungsten silicide on polysilicon), layer, to be used as the control gate for the flash memory devices, an underlying ONO layer, and the polysilicon floating gate shape. A third region of the semiconductor substrate, to be used for word line contact, for the flash memory devices, is comprised of the ONO capping layer, and the polycide layer, overlying an ONO layer, and the tunnel oxide layer, located overlying an isolation region, while the first region of the semiconductor substrate, used for the peripheral devices, is still covered by only the intrinsic polysilicon layer, on the gate insulator layer. After creation of medium doped source/drain, (MDD), and double diffused source/drain, (DDD), regions, in an area of the second region of the semiconductor substrate, not covered by the stacked gate structures, peripheral gate structure are formed, from the intrinsic polysilicon layer, on the first region of the semiconductor substrate. Lightly doped, (LDD), source and drain regions, are next formed in areas of the first region of the semiconductor substrate, not covered by the peripheral gate structures, followed by the formation of silicon nitride spacers, on the sides of both the peripheral gate structures, and the sides of the stacked gate structures, followed by the formation of heavily doped source/drain regions in the first and second regions. Salicided, (Self-Aligned metal siLICIDED), regions are then selectively formed, on the top surface of the peripheral gate structures, and on the source/drain regions, exposed between peripheral gate structures, in the first region of the semiconductor substrate, and formed on the source/drain regions, exposed between cell word line regions, in the second region of the semiconductor substrate.

A deposition of an interlevel dielectric, (ILD), layer, is next performed, overlying, and completely filling the spaces between the stacked gate structures, and overlying the layers used for word contacts, in the third region of the semiconductor substrate, and also overlying the peripheral gate structures, and salicided source/drain regions, located in the first region of the semiconductor substrate. Planarization of the ILD layer follows. A photolithographic and selective RIE procedure, is then used to create self-aligned contact, (SAC), openings in the ILD layer, with the openings larger in width than the space between stacked gate structures, but as a result of the selective RIE procedure, only exposing source/drain region, located between the insulator spacers, on the stacked gate structures. The photolithographic and selective RIE procedure, also simultaneously form contact holes in the ILD layer, exposing the salicided source/drain regions, in the peripheral region of the semiconductor substrate. A contact hole opening is formed in the ILD layer, and in the overlying ONO cap layer, exposing a portion of the polycide layer, used for word line contact purposes, in the third region of the semiconductor substrate. SAC structures are next formed in the SAC openings, in the flash memory cell region, while conductive plug structures are also simultaneously formed, contacting the salicided source/drain regions, exposed in the contact hole, in the peripheral region, while a conductive plug structure is also formed on the polycide layer, exposed in the contact hole in the word line contact region. A first level metal interconnect structure is then formed, followed by the normal back end via and metal processes, allowing integration of the peripheral devices and the flash memory cell, to be accomplished.

BRIEF DESCRIPTION OF THE DRAWINGS

The object and other advantages of this invention are best described in the preferred embodiment with reference to the attached drawings that include:

FIGS. 1–6, 7B, 8–15, which schematically, in cross-sectional style, show the key stages of fabrication used to simultaneously fabricate the flash memory cell, featuring the SAC structure, and to fabricate the peripheral devices, featuring salicided gate, and source/drain regions.

DESCRIPTION OF THE PREFERRED EMBODIMENTS

Figure 3:
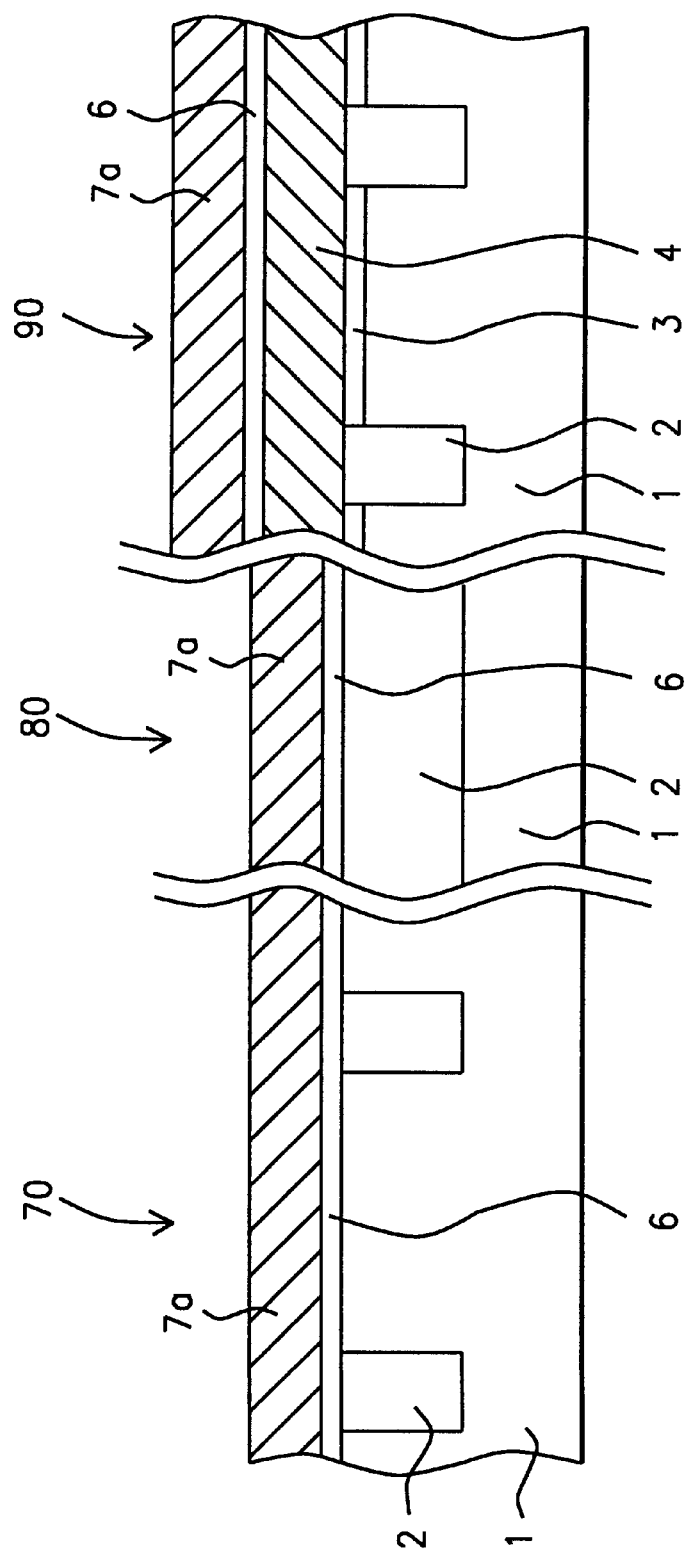

The method of simultaneously fabricating a flash memory cell, incorporating SAC structures, to source/drain regions, located self-aligned between stacked gate structures, and peripheral devices, featuring selectively formed salicided regions, will now be described in detail. This invention will be described using an N type, source/drain regions, however if desired this invention can be applied to P type, source/drain regions.

A P type, semiconductor substrate 1, comprised of single crystalline silicon with a <100> crystallographic orientation, is used and schematically shown in FIG. 1. Region 70, will be used to illustrate the stages of fabrication, used for the flash memory cell, while region 80, will be used to illustrate the fabrication of the word line contact region. The fabrication of the salicided, peripheral devices, will be described in region 90, of the drawings. Isolation regions 2, either shallow trench isolation, (STI), or thermally formed, field oxide, (FOX), are next formed in semiconductor substrate 1, at a thickness between about 3000 to 8000 Angstroms. STI regions are formed via the etching of a shallow trench, in semiconductor substrate 1, via conventional photolithographic and RIE procedures, using $Cl_2$ as an etchant, followed by deposition of a silicon oxide layer, via low pressure chemical vapor deposition, (LPCVD), plasma enhanced chemical vapor deposition, (PECVD), or high density plasma chemical vapor deposition, (HDPCVD), procedures, followed by the removal of unwanted regions of silicon oxide, via a selective RIE procedure, using $CHF_3$ as an etchant, or via a chemical mechanical polishing, (CMP), procedure, resulting in the insulator filled, shallow trench. The FOX isolation region, can be formed via thermal oxidation of regions of semiconductor substrate 1, not covered by a oxidation resistant mask pattern, such as silicon nitride. After formation of the FOX region, the oxidation resistant mask pattern is removed, exposing the subsequent device region. This is schematically shown in FIG. 1.

A gate insulator layer 3, comprised of silicon dioxide, is thermally grown in an oxygen-steam ambient, at a thickness between about 20 to 250 Angstroms, on all regions of semiconductor substrate, not occupied by isolation regions 2, followed by the deposition of an intrinsic polysilicon layer 4, via use of LPCVD procedures, at a thickness between about 1500 to 3000 Angstroms. The result of the gate oxidation, and LPCVD procedure, is schematically shown in FIG. 1. Photoresist shape 5, is used as a mask, to protect region 90, from the procedures used to remove intrinsic polysilicon layer 4, and gate insulator layer 3, from region 70, the flash gate memory cell region, and from region 80, the word line contact region. This is accomplished via a RIE procedure using $Cl_2$ as an etchant for intrinsic polysilicon layer 4, while either a RIE procedure, using $CHF_3$, or a buffered hydrofluoric acid procedure, is used to remove gate insulator layer 3. This is schematically shown in FIG. 2. Photoresist shape 5, is removed via plasma oxygen ashing and careful wet clean procedures.

Figure 4:
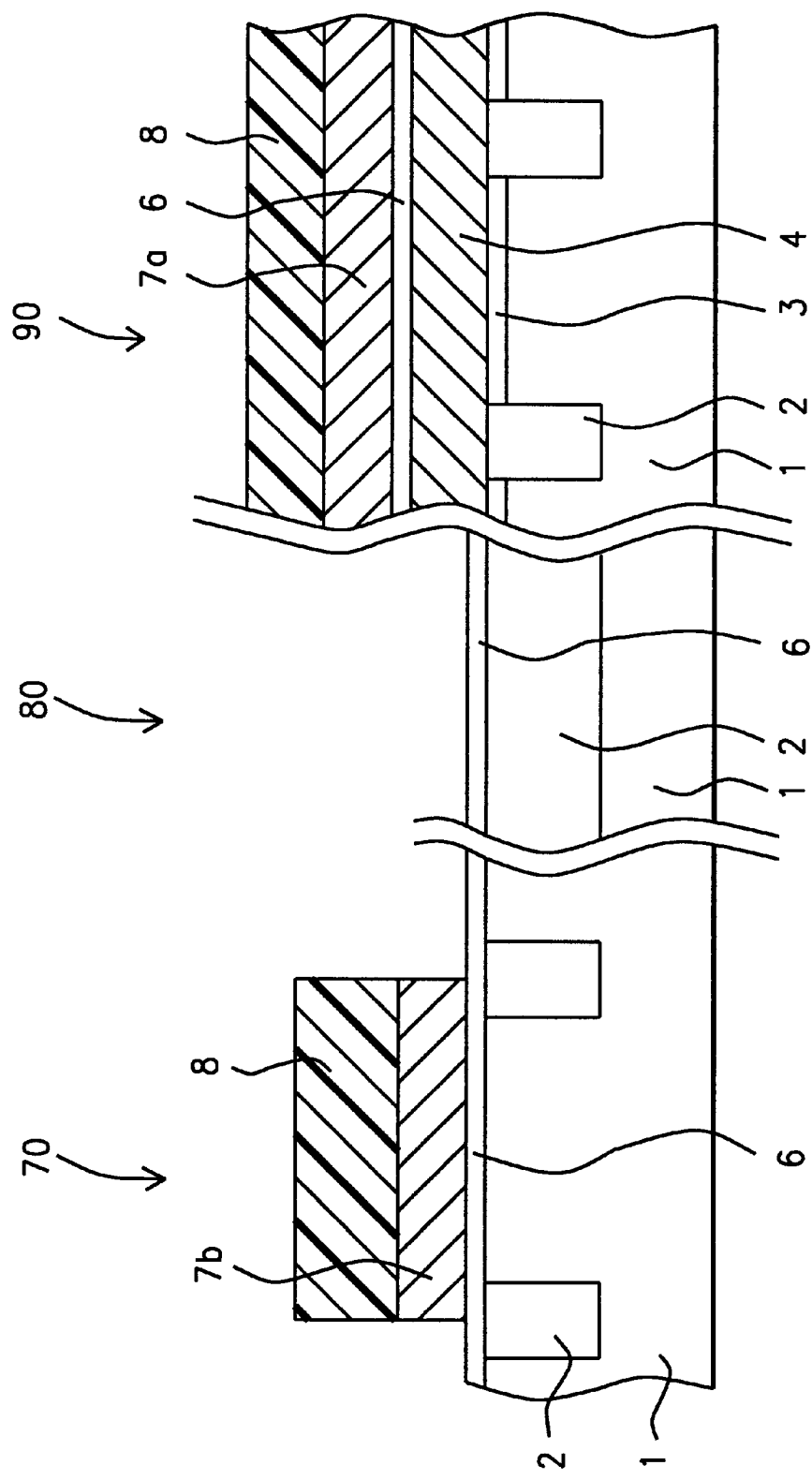

A tunnel oxide layer 6, comprised of silicon dioxide, is thermally grown in an oxygen-steam ambient, at a temperature between about 800 to 1000° C., to a thickness between about 80 to 120 Angstroms, on the top surface of semiconductor substrate 1, in flash memory cell region 70, and in word line contact region 80, while tunnel oxide layer 6, is formed on the top surface of intrinsic polysilicon layer 4, in peripheral device region 90. Polysilicon layer 7a, shown schematically in FIG. 3, is next deposited via LPCVD procedures, to a thickness between about 700 to 1500 Angstroms, an doped insitu, during deposition, via the addition of arsine, or phosphine, to a silane ambient. Photoresist shape 8, is then used as a mask to allow an anisotropic RIE procedure, using $Cl_2$ as an etchant, to create polysilicon floating gate shape 7b, in flash memory cell region 70, Polysilicon layer 7a, and underlying tunnel oxide layer 6, in word line contact region 80, are removed during the above RIE procedure, while polysilicon layer 7a, was protected from the RIE procedure, by photoresist shape 8, in peripheral device region 90. This is schematically shown in FIG. 4. Polysilicon floating gate shape 7b, will subsequently be patterned to create a polysilicon floating gate structure, for the flash memory cell. Photoresist shape 8, is removed via plasma oxygen ashing and careful wet cleans.

Figure 5:
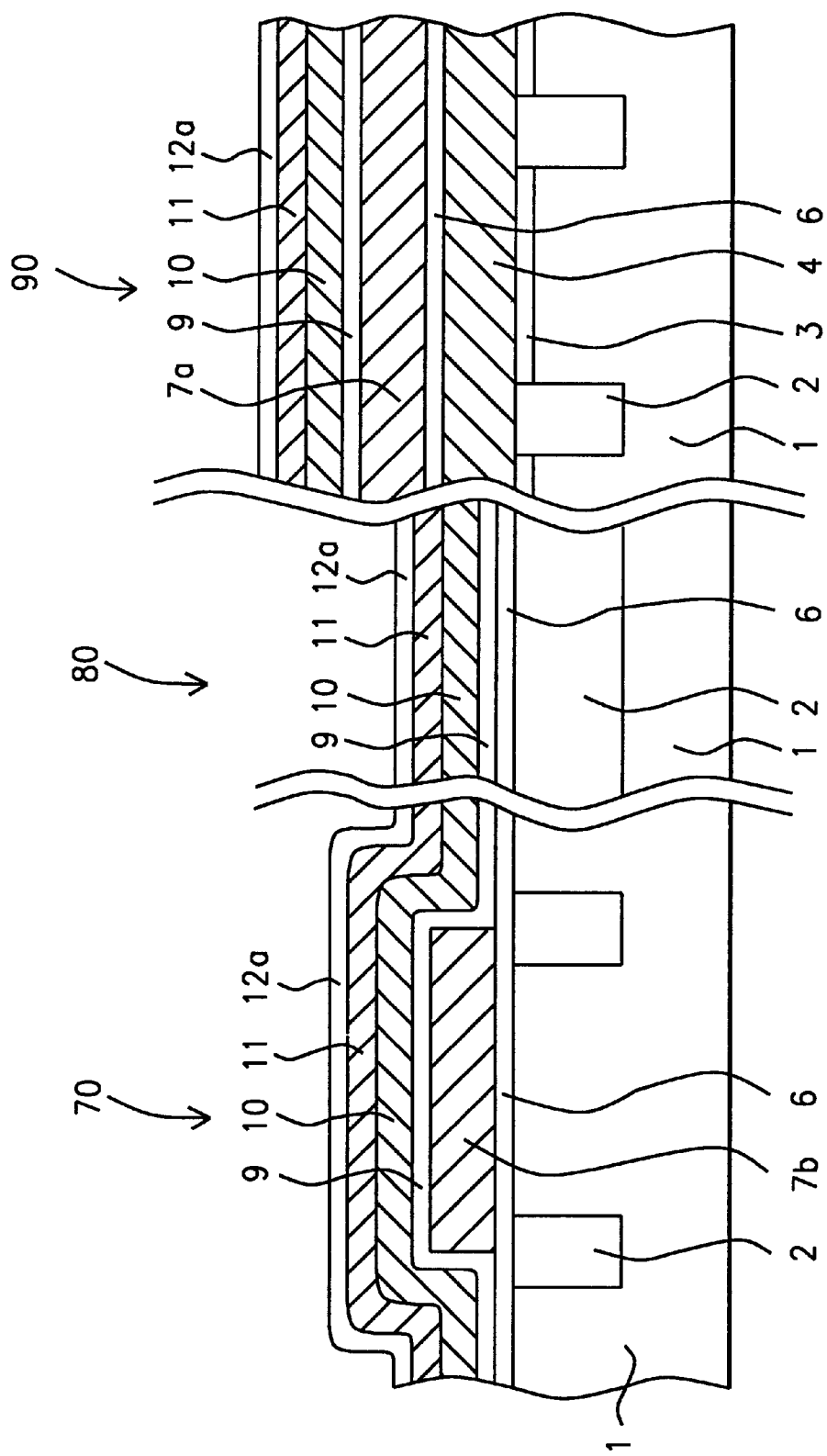

A inter-polysilicon dielectric layer 9, such as ONO, (Oxidized silicon Nitride layer on silicon Oxide), is next formed on: floating gate shape 7b, of region 70; on tunnel oxide layer 6, in region 80; and on polysilicon layer 7a, in region 90. ONO layer 9, is formed by depositing a thin silicon oxide layer, followed by deposition of a thin silicon nitride layer, via LPCVD, PECVD, or HDPCVD procedures, to a thickness between about 50 to 150 Angstroms, followed by a thermal oxidation procedure, converting the silicon nitride layer to the ONO layer, at a silicon dioxide equivalent thickness of between about 100 to 300 Angstroms. A polycide layer, comprised of underlying, polysilicon layer 10, and overlying tungsten silicide layer 11, is next deposited. Polysilicon layer 10, is deposited via LPCVD procedures, at a thickness between about 1000 to 2000 Angstroms, and is in situ doped, during deposition via the addition of arsine, or phosphine, to a silane ambient, while tungsten silicide layer 11, is also deposited via LPCVD procedures, to a thickness between about 1000 to 2000 Angstroms, using tungsten hexafluoride and silane as reactants. The polycide layer, will subsequently be used to create the control gate shape of the flash memory cell. Another ONO layer 12a, to be used as a capping layer for subsequent stacked gate structures, at an equivalent silicon dioxide thickness between about 500 to 3000 Angstroms, is formed on the underlying tungsten silicide layer, using the identical processing procedures used to previously form ONO layer 9. The result of these depositions are schematically shown in FIG. 5.

Figure 6:
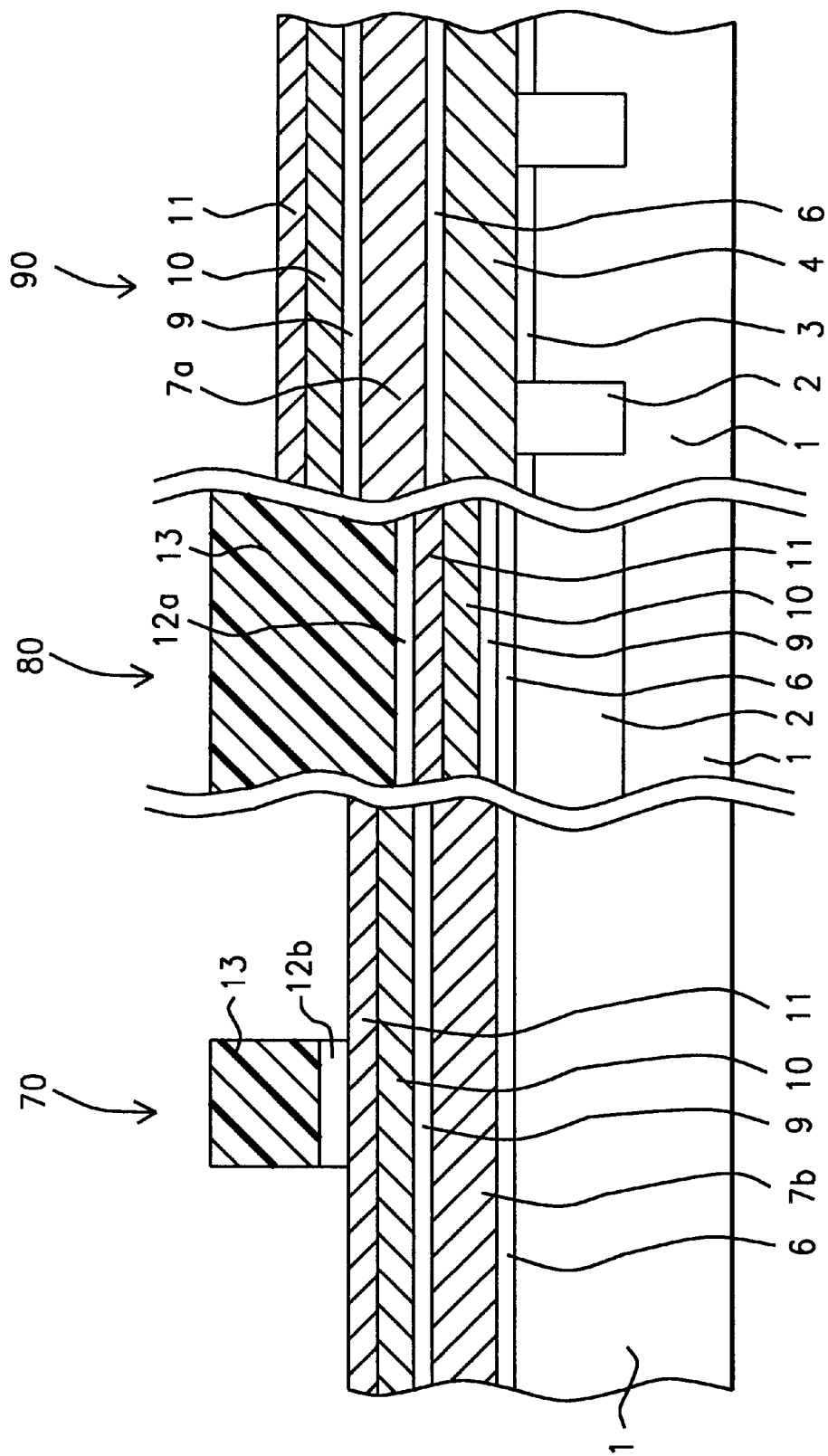
Figure 7A:
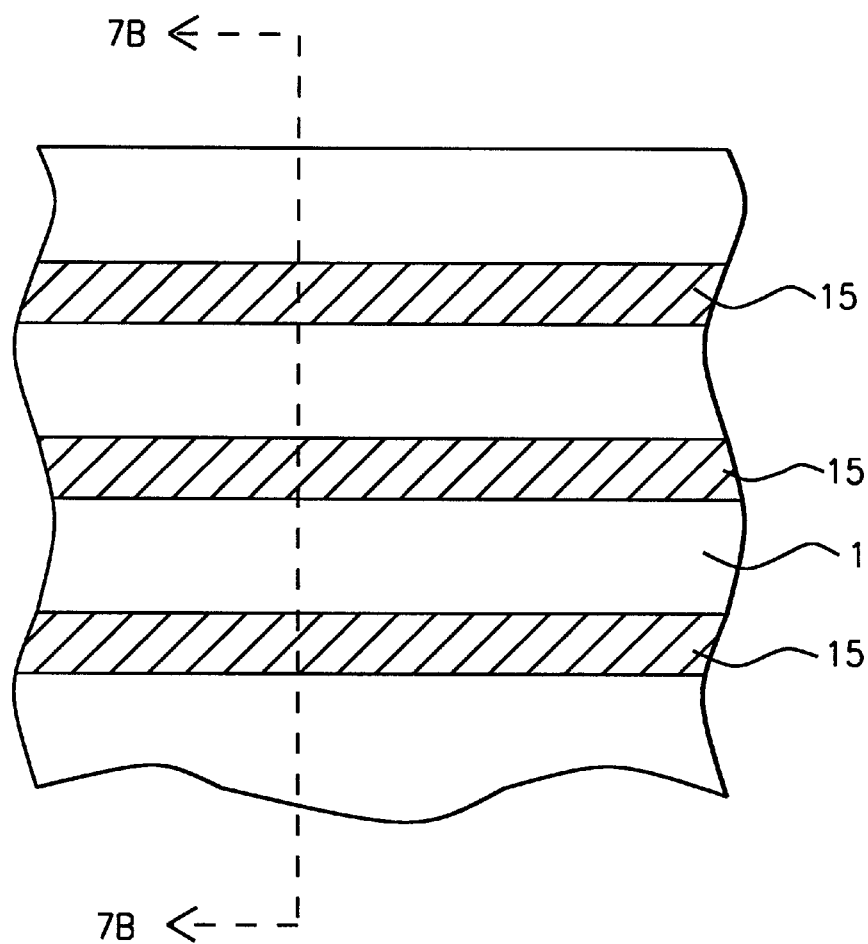
FIG. 7A, which schematically shows the top view of the flash memory cell, at a key stage of fabrication.
Figure 7B:
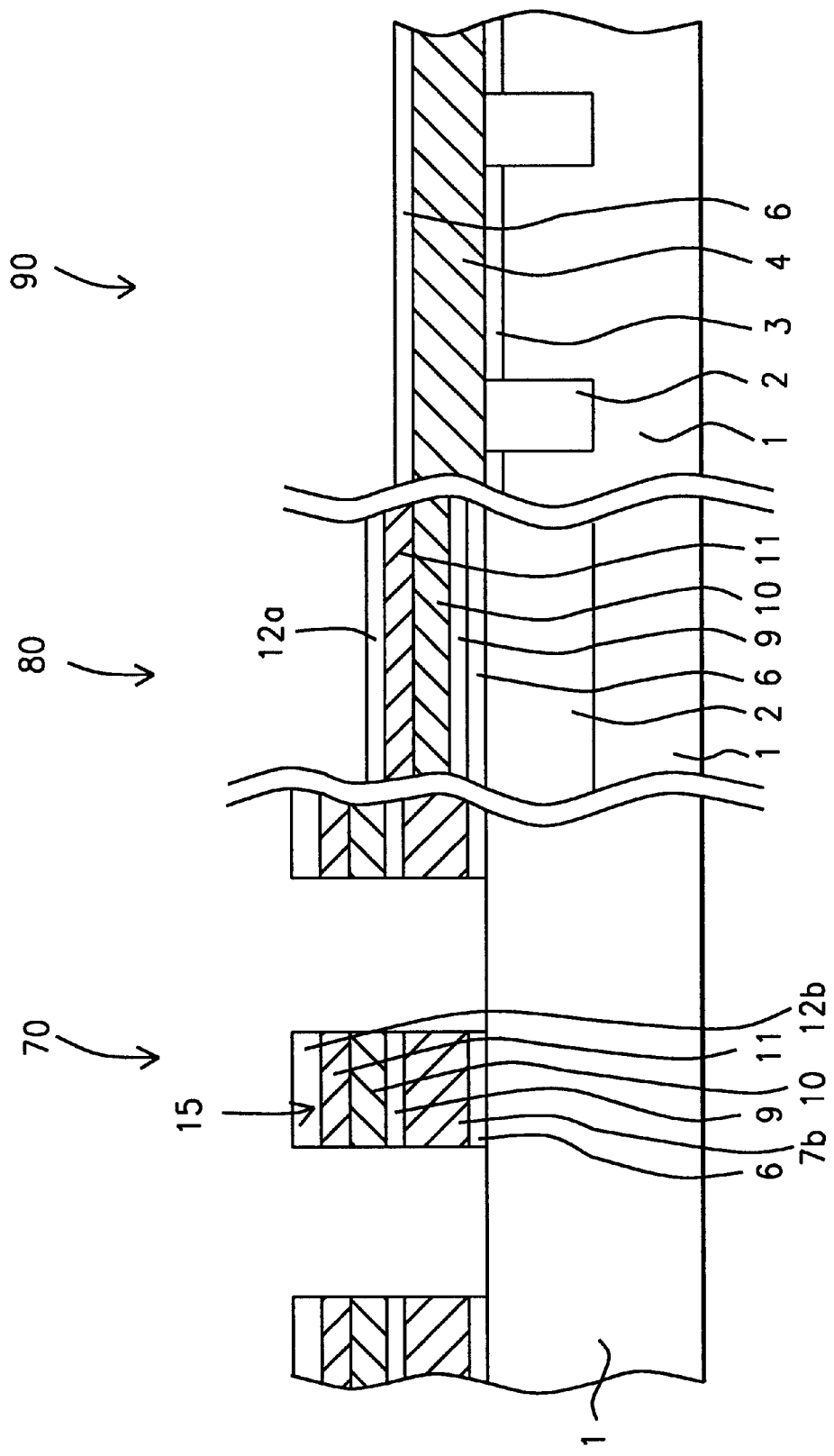
Figure 8:
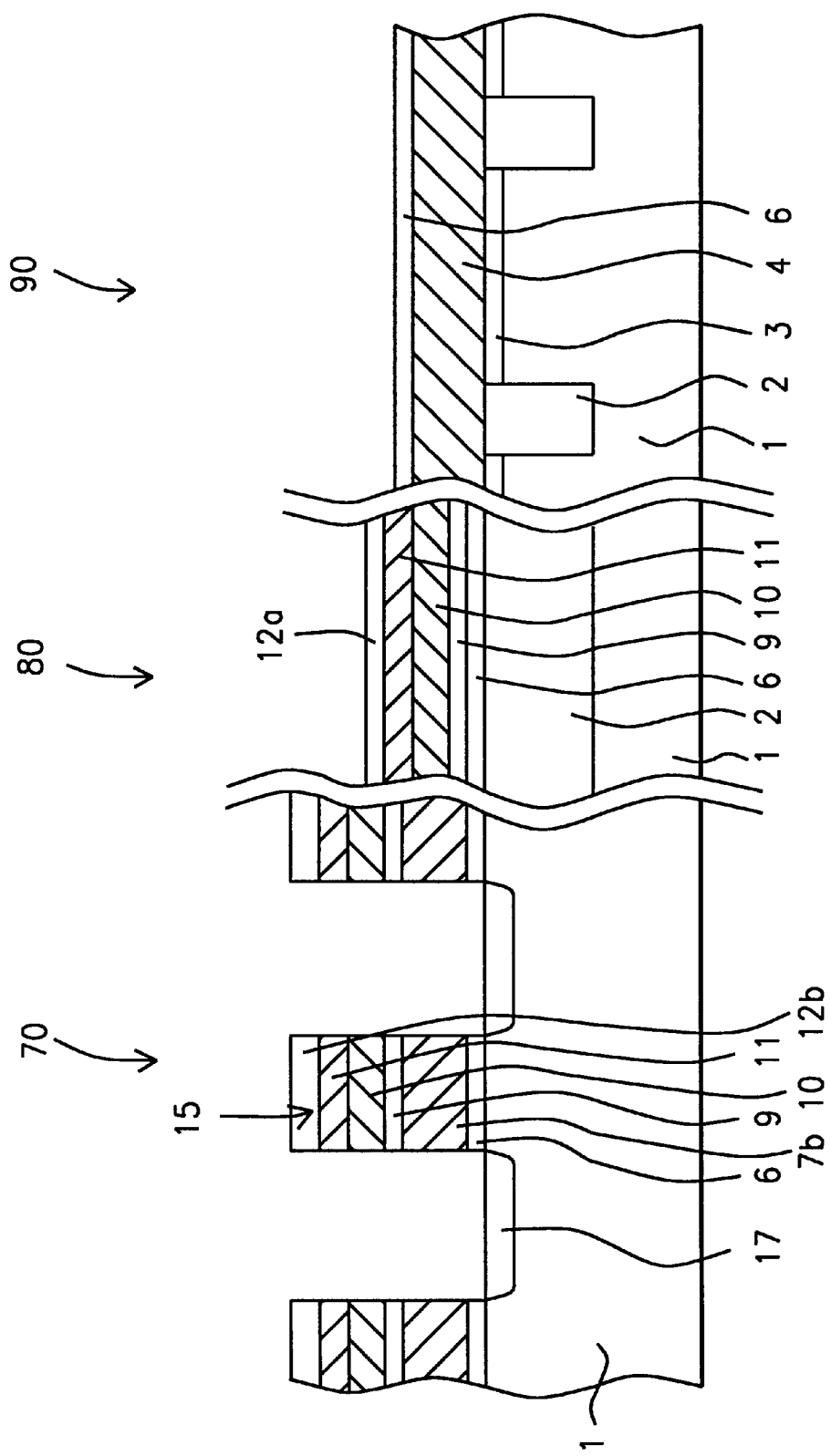

Photoresist shape 13, is next used as an etch mask, to allow a RIE procedure, using $CHF_3$ as an etchant, to remove ONO layer 12a, from the top surface of tungsten silicide layer 11, in peripheral device region 90, while creating ONO shape 12b, on tungsten silicide layer 11, in flash memory cell region 70. ONO layer 12a, remains on tungsten silicide layer 11, in word line contact region 80, protected by photoresist shape 13. This is schematically shown in FIG. 6. After removal of photoresist shape 13, via plasma oxygen ashing and careful wet cleans, ONO shape 12b, and 12a, are uses as a hard mask to allow stacked gate structures 15, in flash memory cell region 70. to be formed. Stacked gate structures 15, are formed via an anisotropic RIE procedure, using $CHF_3$ as an etchant for ONO layer 9, while using $Cl_2$ for tungsten silicide layer 11, for polysilicon layer 10, and for polysilicon floating gate shape 7b. Portions of tunnel oxide layer 6, not covered by stacked gate structures 15, in flash memory cell region 70, are removed during subsequent wet clean procedures, used after subsequent plasma oxygen, photoresist ashing procedures. This is schematically shown, in cross-sectional style in FIG. 7B, while a top view of flash memory cell 15, is shown schematically in FIG. 7A. The tungsten silicide 11, polysilicon 10, shape, will be used as for the control gate of the flash memory cell. The anisotropic RIE procedure also results in the removal of ONO layer 9, tungsten layer 11, polysilicon layer 10, and polysilicon layer 7a, from the top surface of tunnel oxide layer 6, in peripheral device region 90. The anisotropic RIE procedure does not remove any material, protected by the thick ONO shape, in word line contact region 80. This is schematically shown in FIG. 7B. A photoresist blockout shape, not shown in the drawings, is then used as a mask, to allow a medium doped, source/drain, (MDD), region 17, to be formed in regions of semiconductor substrate 1, not covered by stacked gate structures 15, in flash memory cell region 70, via an ion implantation procedure, performed at an energy between about 30 to 70 KeV, at a dose between about 1E14 to 5E15 atoms/$cm^2$, using arsenic or phosphorous ions. This is schematically shown in FIG. 8. The photoresist blockout shape is removed via plasma oxygen ashing and careful wet cleans.

Figure 9:
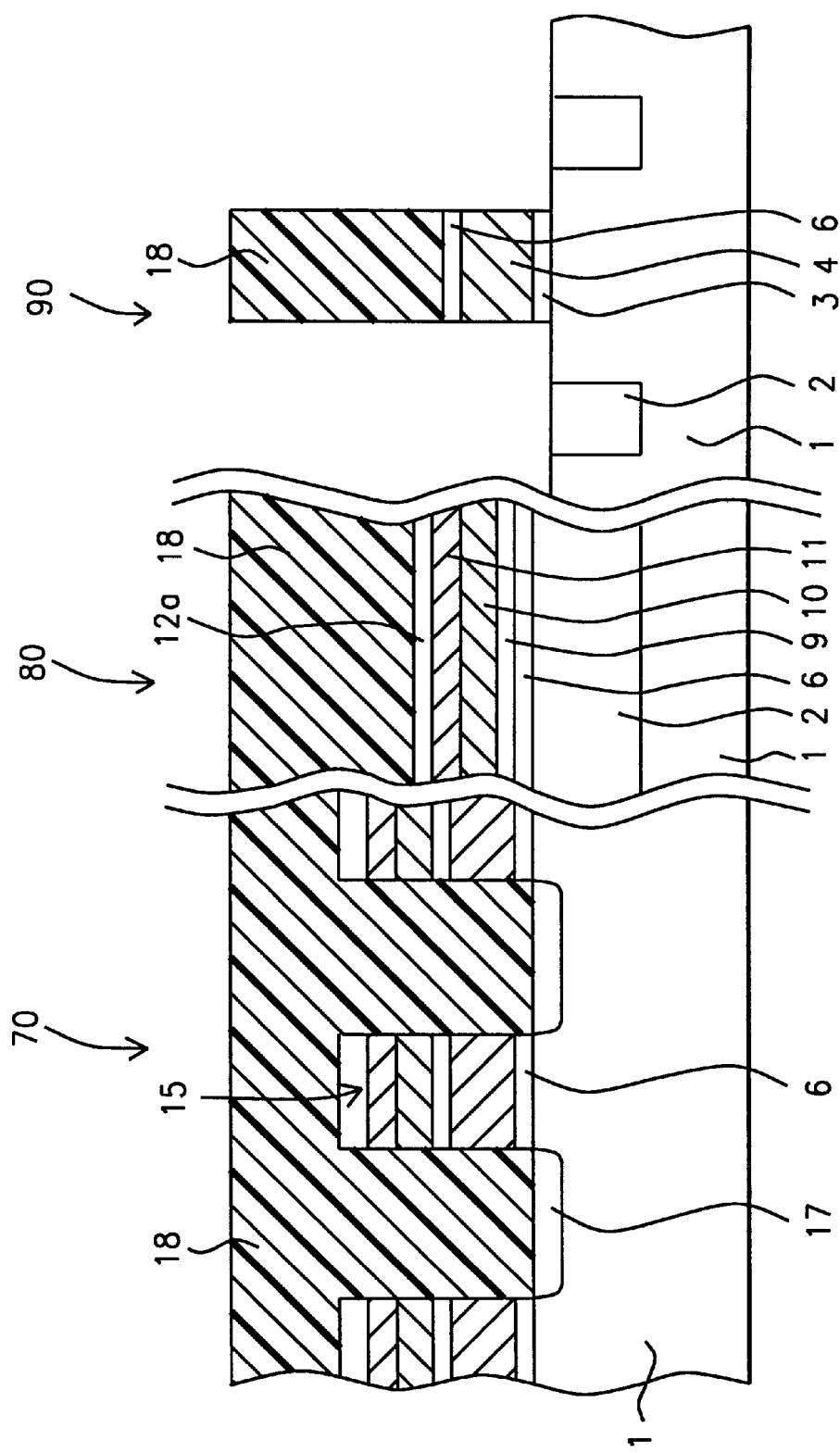
Figure 10:
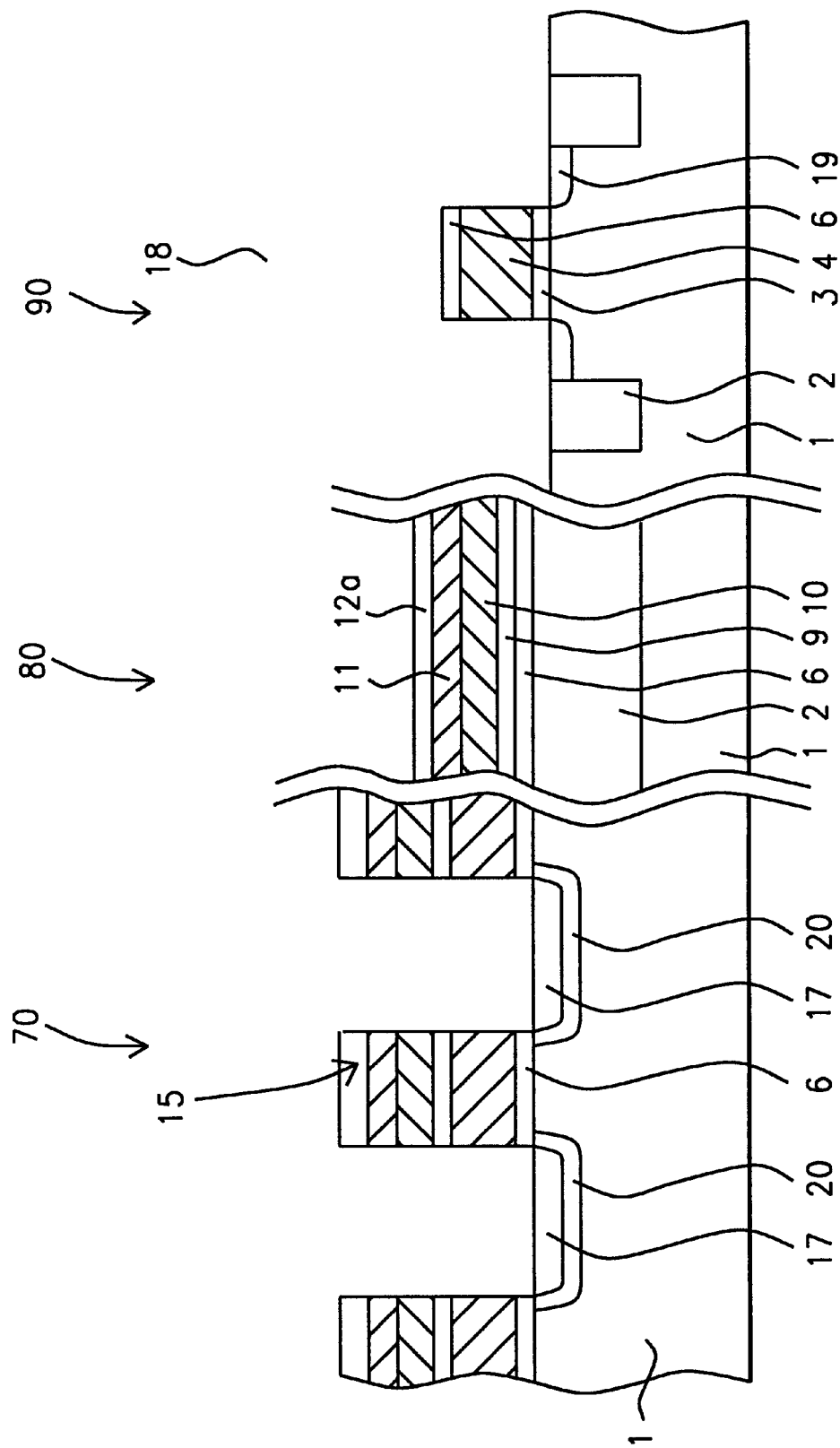

Photoresist shape 18, is next used to protect flash memory cell region 70, and word line contact region 80, and is also used as a mask to create a gate structure, in peripheral region 90. This is accomplished via an anisotropic RIE procedure, using $CHF_3$ as an etchant for tunnel oxide layer 6, and using $Cl_2$ as an etchant for intrinsic polysilicon layer 4. Portions of gate insulator layer 3, not covered by the gate structure, are removed during a wet clean procedure, performed after removal of photoresist shape 18, via use of plasma oxygen ashing procedures. This is schematically displayed in FIG. 9. A photoresist blockout mask, not shown in the drawings, is then used to create lightly doped source/drain, (LDD), region 19, in areas of peripheral device region 90, not covered by the gate structure. The LDD region is created via ion implantation of arsenic or phosphorous ions, if an NFET device is desired, or boron or $BF_2$ ions, if a PFET device is desired, at an energy between about 10 to 60 KeV, at a dose between about 5E13 to 7E14 atoms/$cm^2$. This is schematically shown in FIG. 10. The photoresist blockout mask, used to protect flash memory cell 70, and word line contact region from the LDD, ion implantation procedure, is removed via plasma oxygen ashing procedures and careful wet cleans. Another photoresist blockout mask, not shown in the drawings, is now used to allow a double diffused source/drain, (DDD), region, 20, to form only in areas of flash memory cell region 70, not covered by stacked gate structures 15. DDD regions 20, schematically shown in FIG. 10, are formed via ion implantation of arsenic or phosphorous ions, at an energy between about 30 to 70 KeV, and at a dose between about 5E13 to 5E14 atoms/$cm^2$. Some designs may use the DDD implant region, only the cell drain side. The photoresist block out mask, used to protect word line contact region 80, and peripheral device region 90, from the DDD ion implantation procedure, is once again removed via plasma oxygen ashing and careful wet clean procedures.

Figure 11:
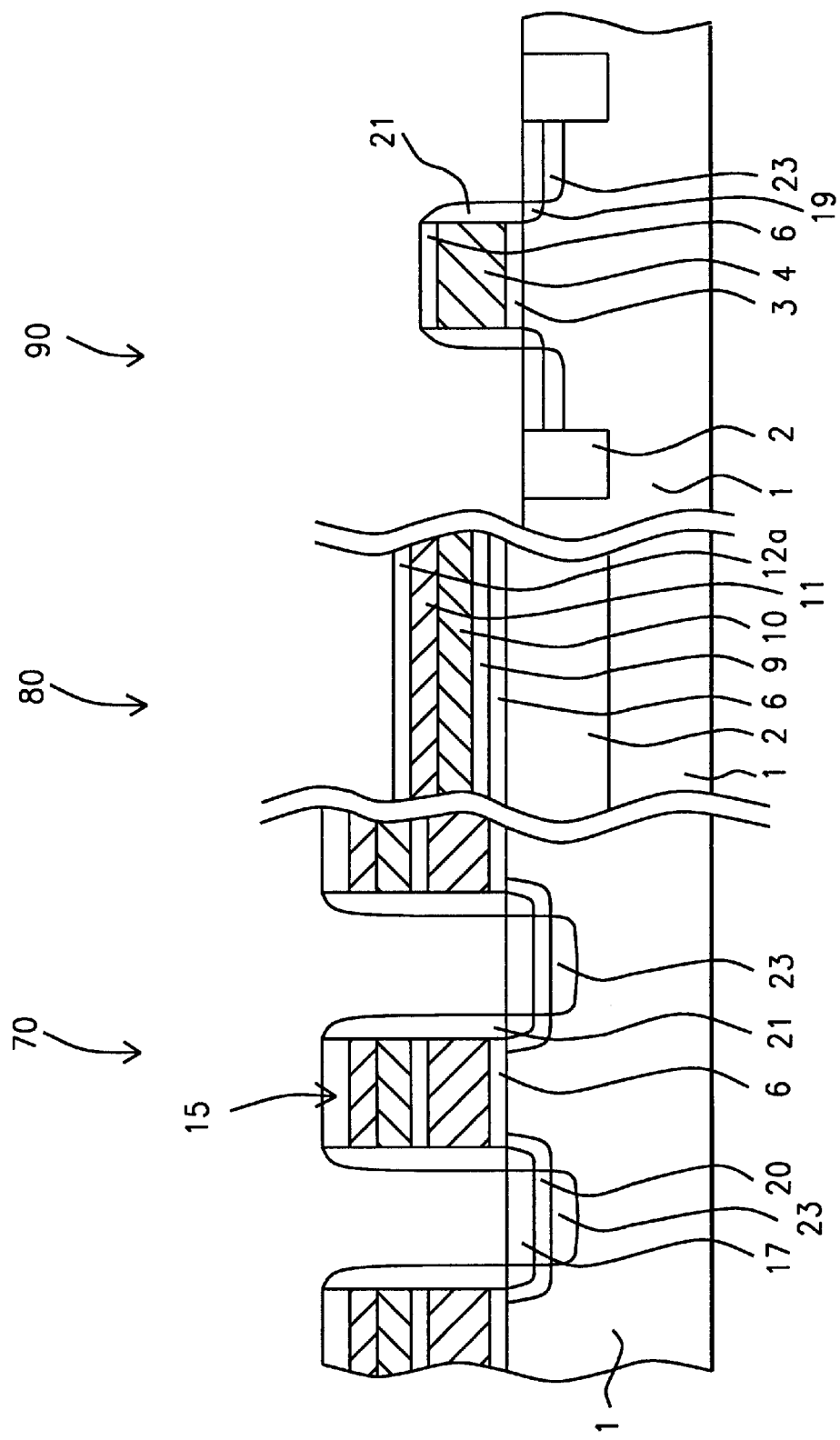

Insulator spacers 21, comprised of silicon nitride, are next formed on the sides of the gate structure, in peripheral device region 90, and on the sides of stacked gate structures 15, in flash memory cell region 70. This is accomplished via deposition of a silicon nitride layer, using LPCVD or PECVD procedures, at a thickness between about 1000 to 2500 Angstroms, followed by an anisotropic RIE procedure, using $CF_4$ as an etchant. Heavily doped source/drain region 23, is than formed the area of peripheral device region 90, and in the area of cell region 70, not covered by gate structure, or by the insulator spacers. This is schematically shown in FIG. 11. Heavily doped source/drain region 23, is formed via an ion implantation procedure, at an energy between about 5 to 60 KeV, at a dose between about 1E15 to 8E15 atoms/$cm^2$, using arsenic or phosphorous ions, or using boron or $BF_2$ ions, if PFET devices are desired.

Figure 12:
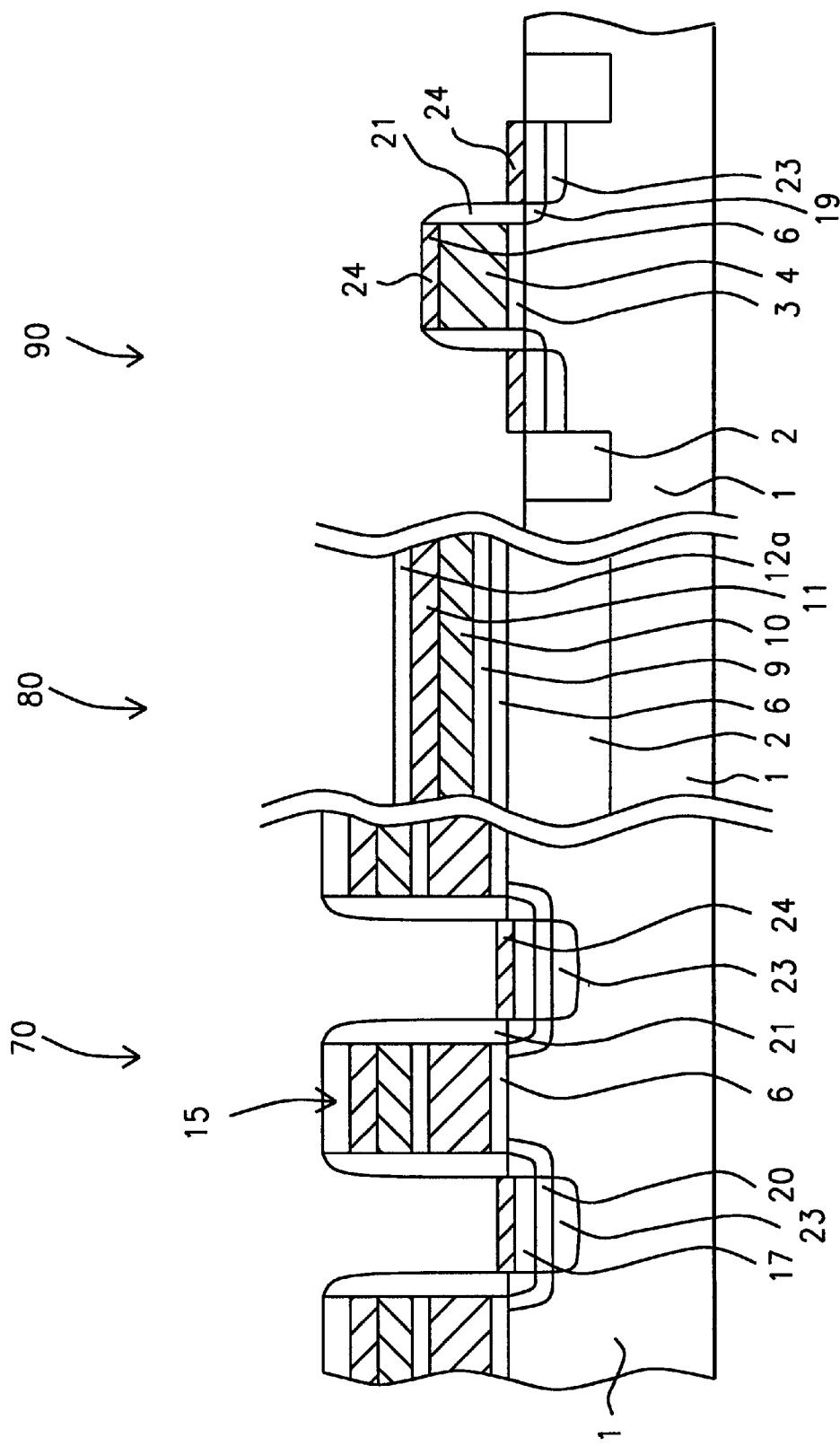

After removal of tunnel oxide layer 6, from the top surface of the gate structure, in peripheral device region 90, a surface of the gate structure, in peripheral device region 90, a metal layer, such as titanium is deposited, using R.F. sputtering procedures, at a thickness between about 200 to 500 Angstroms. An anneal procedure, performed using a rapid thermal anneal, (RTA), or conventional furnace procedure, is then employed at a temperature between about 650 to 800 C., to selectively form metal silicide layer 24, such as titanium disilicide, only on regions in which the metal layer directly overlaid a silicon, or a polysilicon region. Metal layer, residing on ONO shapes 12a, and 12b in flash memory cell region 70, and in word line contact region 80, as well as the portion of the metal layer residing on insulator spacers 21, remained unreacted during the anneal procedure. Selective removal of unreacted metal, is next accomplished in a solution containing $H_2O_2$—$NH_4OH$—$HCl$—$H_2O$, at a temperature between about 25 to 100° C., leaving metal silicide layer 24, only on heavily doped source/drain regions 23, and on the top surface of the gate structure, in peripheral device region 90. This is schematically shown in FIG. 12.

Figure 13:
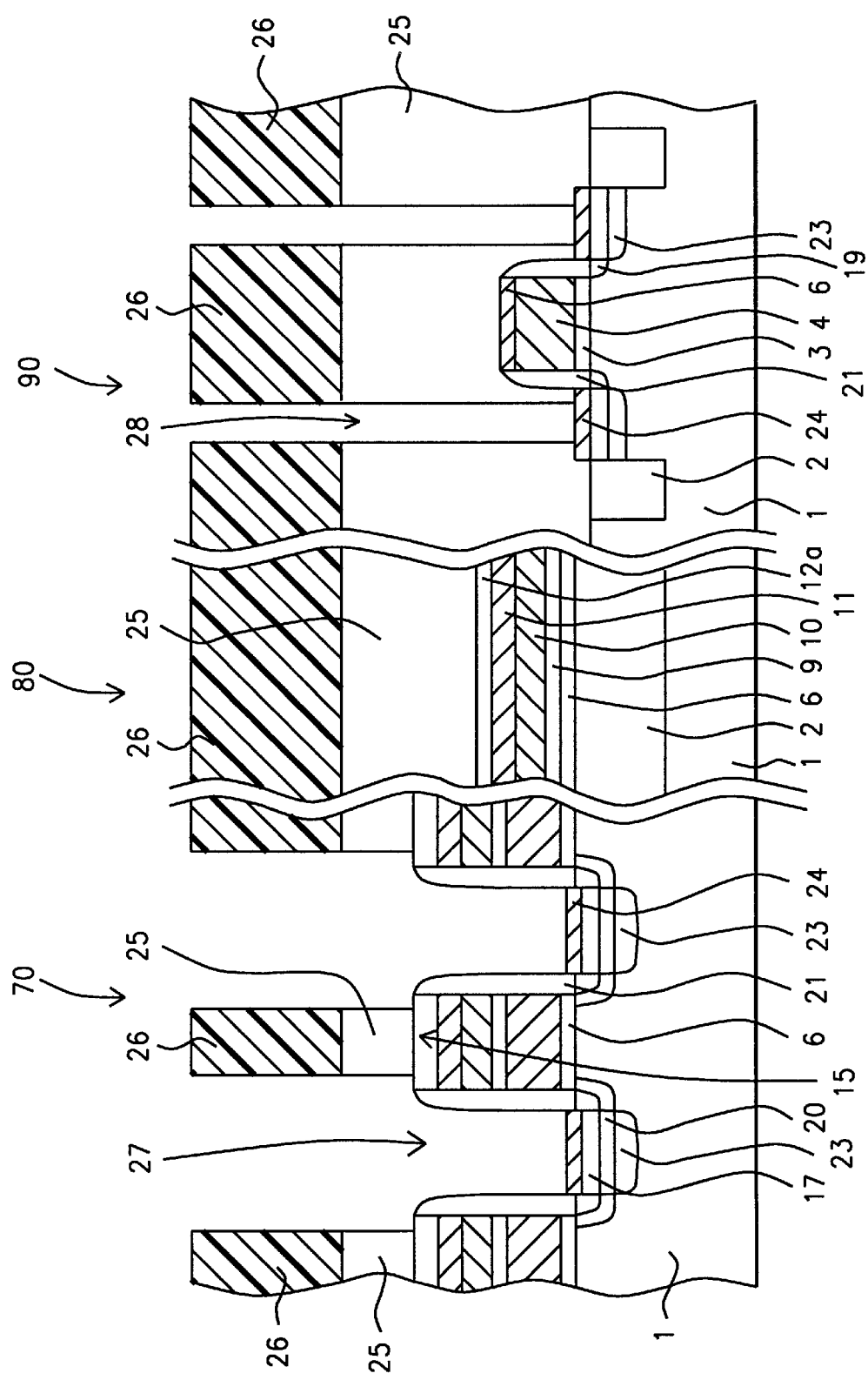
Figure 14:
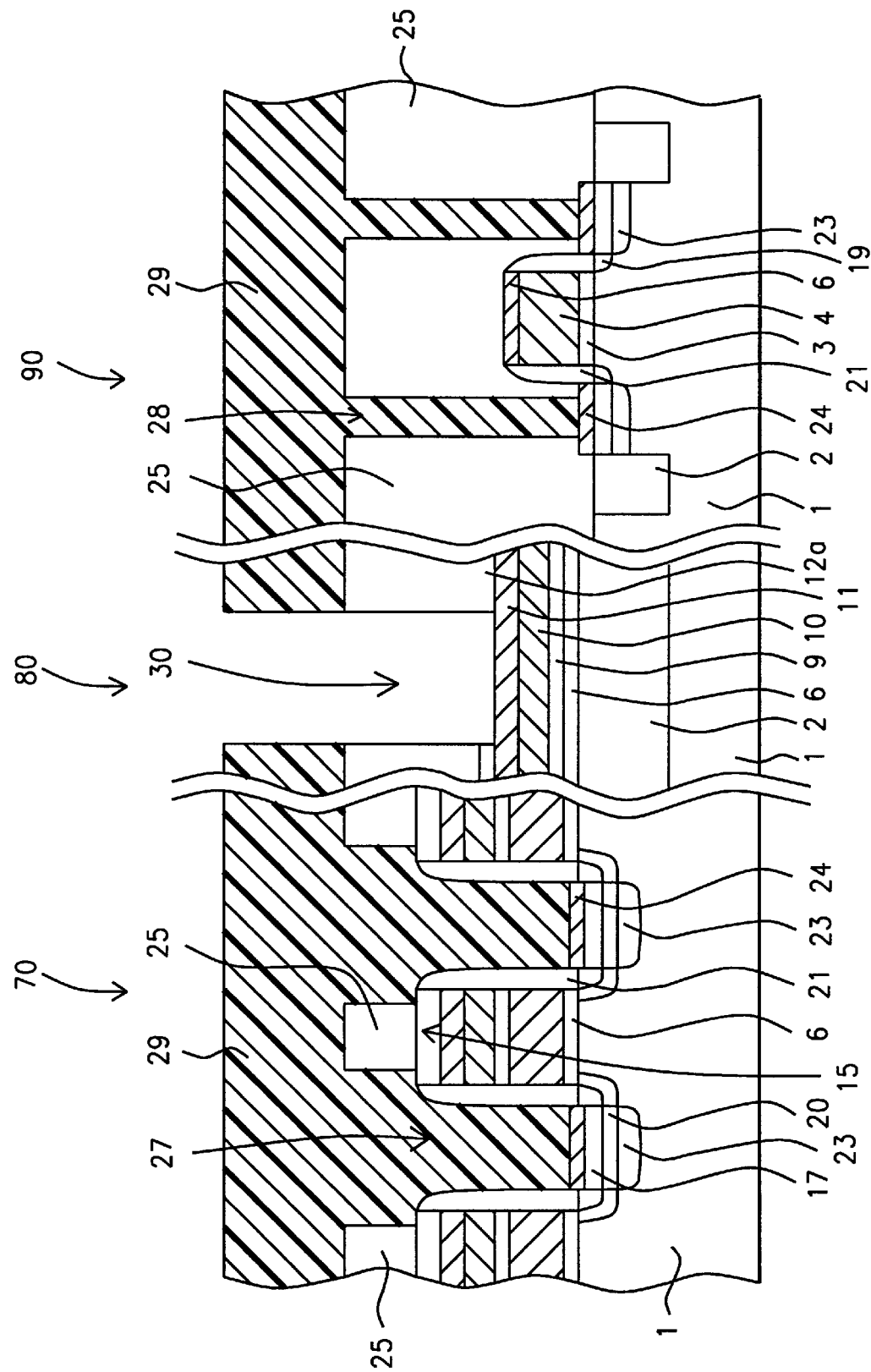

An interlevel dielectric, (ILD), layer 25, comprised of silicon oxide, obtained via LPCVD or PECVD procedures, at a thickness between about 8000 to 15000 Angstroms, is then deposited, completely filling the spaces between stacked gate structures 15. Planarization of ILD layer 25, is then accomplished via a CMP procedure, resulting in a smooth top surface topology for ILD layer 25, schematically shown in FIG. 13, reducing the severity of the subsequent, photolithographic procedure, used for openings in the ILD layer, to underlying regions. Photoresist shape 26, is next used as a mask to allow an anisotropic RIE procedure to create SAC openings 27, exposing DDD region 24, in flash memory cell region 70, while simultaneously creating openings 28, in peripheral device region 90, exposing the salicided, source/drain regions 24. SAC opening 27, with a width between about 8000 to 15000 Angstroms, wider then the space between stacked gate structures 15, is created via a RIE procedure, using CHF$_3$ as an etchant for ILD layer 25, while openings 28, in peripheral region 90, are formed only in ILD layer 25, via the above RIE procedure. This is schematically shown in FIG. 13. After removal of photoresist shape 26, via plasma oxygen ashing and careful wet cleans, photoresist shape 29, is formed, and used as a mask to allow contact hole 30, to be opened in ILD layer 25, and in ONO layer 12a, via a RIE procedure, using CHF$_3$ as an etchant, exposing a portion of the top surface of tungsten silicide layer 11, in word line contact region 80. This is schematically shown in FIG. 14.

Figure 15:
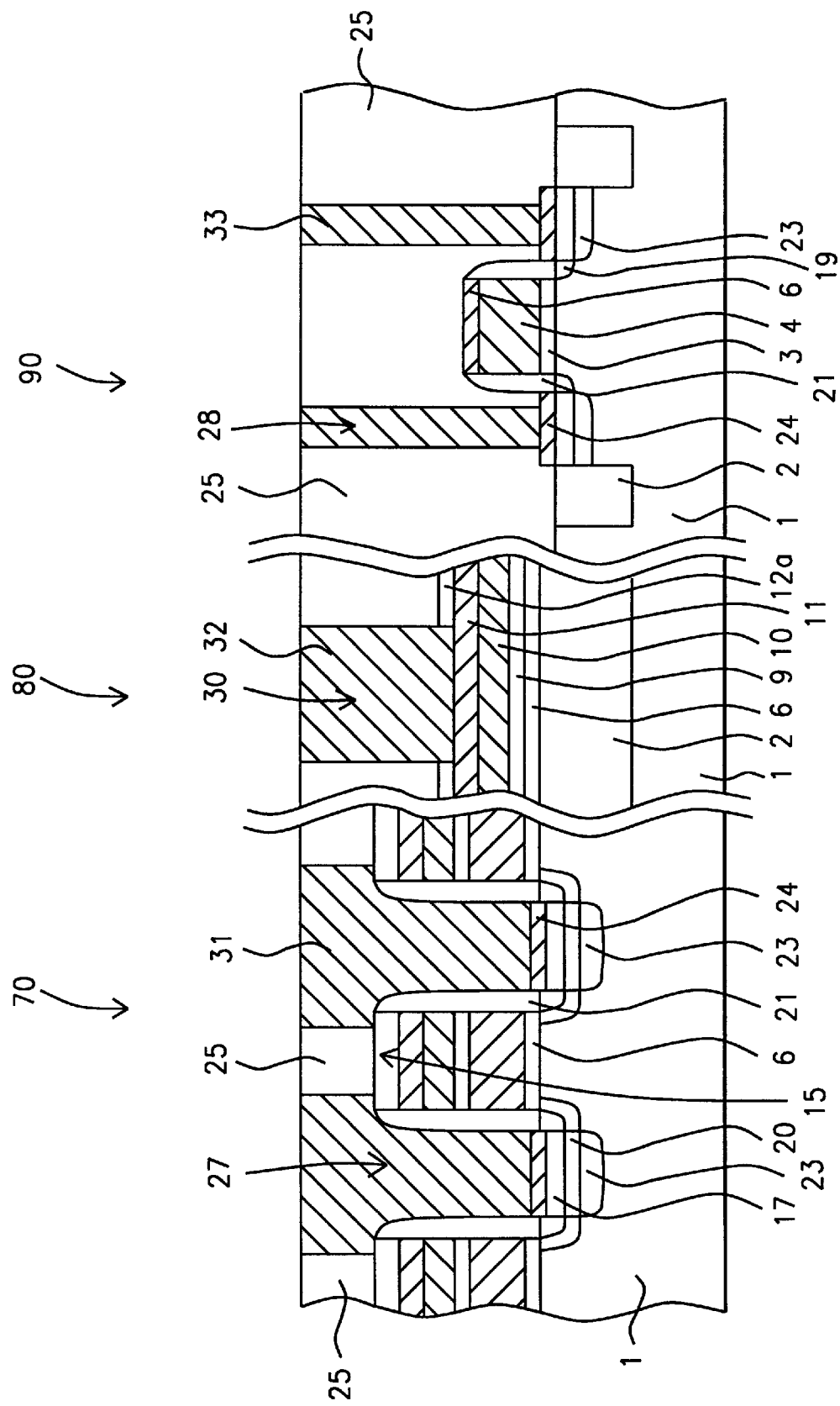

After removal of photoresist shape 29, via plasma oxygen ashing and careful wet cleans, SAC structures 31, are formed in SAC openings 27, via LPCVD deposition of a conductive material, such as tungsten, or doped polysilicon, to a thickness between about 3000 to 8000 Angstroms, completely filling SAC openings 27. Removal of the conductive material, from the top surface of ILD layer 25, is accomplished using either a CMP procedure, or via a selective RIE procedure, using Cl$_2$ as an etchant. These procedures, deposition of a metal or doped polysilicon layer, followed by the CMP or RIE removal procedures, also result in the creation of conductive plug structure 32, in opening 30, contacting the top surface of tungsten silicide layer 11, in word line contact region 80, and also results in the creation of conductive plug structures 33, in openings 28, contacting the salicided, source/drain region 23, located in peripheral device region 90. This is schematically shown in FIG. 15.

Metal interconnect structures, not shown in the drawings, are then formed, contacting, and interconnecting, SAC structures 31, in flash memory cell region 70, conductive plug structure 32, in word line contact region 80, and conductive plug structures 33, in peripheral device region 90. Metal interconnect structures can be between about 3000 to 8000 Angstroms in thickness, comprised of an aluminum based layer, containing between about 0.5 to 4.0 weight percent of copper.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a flash memory cell, and peripheral devices, on a semiconductor substrate, comprising the steps of:

growing a gate insulator layer, and an overlying first polysilicon layer, on a first region of said semiconductor substrate, to be used for said peripheral devices, wherein said first polysilicon layer is an intrinsic layer, obtained via LPCVD procedures at a thickness between 1500 to 3000 Angstroms;

growing a tunnel oxide layer on a second region of said semiconductor substrate, to be used for said flash memory cell, and forming said tunnel oxide layer, on the top surface of said first polysilicon layer;

depositing a second polysilicon layer, on said tunnel oxide, located in said first region of said semiconductor substrate, while forming a polysilicon floating gate shape, on said tunnel oxide layer, via patterning of said second polysilicon layer, in said second region of said semiconductor substrate;

forming stacked gate structures, on said tunnel oxide layer, in said second region of said semiconductor substrate, with each stacked gate structure comprised of: an overlying, first dielectric layer; a polycide layer; an underlying second dielectric layer; and a portion of said polysilicon floating gate shape;

forming a first source/drain region, in an area of said second region of said semiconductor substrate, not covered by said stack gate structures;

patterning of said tunnel oxide layer, and of said first polysilicon layer to form a gate structure, overlying said gate insulator layer, in said first region of said semiconductor substrate;

forming a lightly doped source/drain region, in an area of said first region of said semiconductor substrate, not covered by said gate structure;

forming a second source/drain region, in an area of said second region of said semiconductor substrate, not covered by said stack gate structures;

forming insulator spacers on the sides of said stacked gate structures, and on the sides of said gate structure;

forming a heavily doped source/drain region, in a an area of said first region of said semiconductor substrate, not covered by said gate structure, or by said insulator spacers, and in an area of said second region of said semiconductor substrate, not covered by said stacked gate structures, or by said insulator spacers;

removing said tunnel oxide from the top surface of said gate structure, and selectively forming a metal silicide layer on said heavily doped source/drain regions, and on said top surface of said gate structure, wherein said metal silicide layer is a titanium disilicide layer, formed via initially depositing a titanium layer via R.F. sputtering at a thickness between about 200 to 500 Angstroms, followed by an anneal procedure using either RTA or conventional furnace procedures, at a temperature between about 650 to 800° C., selectively forming said metal silicide layer on said heavily doped source/drain region and on the top surface of said gate structures, located in said first region of said semiconductor substrate, and removing unreacted regions of said titanium layer in a solution containing H$_2$O$_2$—HCl—NH$_4$OH—H$_2$O, at a temperature between about 25 to 100° C.;

depositing a thick interlevel dielectric layer;

forming self-aligned contact, (SAC), openings in said thick interlevel dielectric layer, in said second region of said semiconductor substrate, exposing a portion of the top surface of said stacked gate structures, and exposing said second source/drain region, located between the stack gate structures, while also forming contact hole openings in said thick interlevel dielectric layer, in said first region of said semiconductor substrate, exposing said metal silicide layer, located on said heavily doped source/drain regions;

opening a word line contact hole in said interlevel dielectric layer, and in said first dielectric layer, in a third region of said semiconductor substrate, to expose a portion of the top surface of said polycide layer;

forming conductive SAC structures, in said SAC openings, located in said second region of said semiconductor substrate, forming conductive plug structures in said contact hole openings, located in said first region of said semiconductor substrate, and forming a word line plug structure, in said word line contact hole, located in said third region of said semiconductor substrate; and forming metal interconnect structures, on said thick interlevel dielectric layer, overlying and contacting, said conductive SAC structures, said conductive plug structures, and said word line plug structure.

2. The method of claim 1, wherein said gate insulator, in said first region of said semiconductor substrate, is silicon dioxide, thermally grown in an oxygen-steam ambient, to a thickness between about 20 to 250 Angstroms.

3. The method of claim 1, wherein said tunnel oxide layer is comprised of silicon dioxide, thermally grown in an oxygen-steam ambient, at a temperature between about 800 to 1000° C., to a thickness between about 80 to 120 Angstroms.

4. The method of claim 1, wherein said second polysilicon layer is obtained via LPCVD procedures, to a thickness between about 700 to 1500 Angstroms, and doped in situ, during deposition, via the addition of arsine, or phosphine, to a silane ambient.

5. The method of claim 1, wherein said floating gate shape, located in said second region of said semiconductor substrate, is formed via an anisotropic RIE procedure, performed to said second polysilicon layer, using $Cl_2$ as an etchant.

6. The method of claim 1, wherein said second dielectric layer, and said first dielectric layer, are comprised of ONO, (Oxidized silicon Nitride on Oxide), at an equivalent silicon oxide thickness between about 100 to 300 Angstroms, and formed via initially depositing a silicon nitride layer, on a silicon oxide layer, via LPCVD or PECVD procedures, at a thickness between about 50 to 150 Angstroms, then performing an oxidation procedure, to convert the silicon nitride layer to said ONO layer.

7. The method of claim 1, wherein said polycide layer is comprised of an underlying polysilicon layer, obtained via LPCVD procedures, to a thickness between about 1000 to 2000 Angstroms, and doped in situ, during deposition, via the addition of arsine, or phosphine, to a silane ambient, and comprised of an overlying tungsten silicide layer, obtained via LPCVD procedures, at a thickness between about 1000 to 2000 Angstroms, using silane and tungsten hexafluoride as reactants.

8. The method of claim 1, wherein said stack gate structures, in said second region of said semiconductor substrate, are formed via an anisotropic RIE procedure, using $CHF_3$ as an etchant for said second dielectric layer, and for said first dielectric layer, and using $Cl_2$ as an etchant for said polycide layer, and for said polysilicon floating gate shape.

9. The method of claim 1, wherein said first source/drain region, in said second region of said semiconductor substrate, is a medium doped, source/drain, (MDD), region, obtained via ion implantation of arsenic, or phosphorous ions, at an energy between about 30 to 70 KeV, at a dose between about 1E14 to 5E15 atoms/$cm^2$.

10. The method of claim 1, wherein said lightly doped, source/drain region, in said first region of said semiconductor substrate, is formed via ion implantation of arsenic or phosphorous ions, or of boron or $BF_2$ ions, at an energy between about 10 to 60 KeV, at a dose between about 5E13 to 7E14 atoms/$cm_2$.

11. The method of claim 1, wherein said insulator spacers on the sides of said stacked gate structures, and on the sides of said gate structure, are comprised of silicon nitride, obtained via LPCVD or PECVD deposition, at a thickness between about 1000 to 2500 Angstroms, followed by an anisotropic RIE procedure, using $CF_4$ as an etchant.

12. The method of claim 1, wherein said second source/drain region, is a double diffused source/drain, (DDD), region, formed in said second region of said semiconductor substrate, via ion implantation of arsenic, or phosphorous ions, at an energy between about 30 to 70 KeV, at a dose between about 5E13 to 5E14 atoms/$cm^2$, with said DDD region sometimes created only on the cell drain side.

13. The method of claim 1, wherein said heavily doped source/drain region, located in said first region of said semiconductor substrate, and located in said second region of said semiconductor substrate, is formed via ion implantation of arsenic or phosphorous ions, at an energy between about 5 to 60 KeV, at a dose between about 1E15 to 8E15 atoms/$cm^2$.

14. The method of claim 1, wherein said interlevel dielectric layer is silicon oxide, obtained via LPCVD or PECVD procedures, to a thickness between about 8000 to 15000 Angstroms.

15. The method of claim 1, wherein said SAC openings, in said second region of said semiconductor substrate, and said contact hole openings, in said first region of said semiconductor substrate, are formed in said interlevel dielectric layer, via an anisotropic RIE procedure, using $CHF_3$ as an etchant.

16. The method of claim 1, wherein said conductive SAC structures, in said SAC openings, and said conductive plug structures, in said contact hole openings, are either comprised of polysilicon, obtained via LPCVD procedures, and doped in situ during deposition, via the addition of arsine, or phosphine, to a silane ambient, or comprised of tungsten, obtained via LPCVD procedures.

17. A method of simultaneously fabricating a flash memory cell, in a second region of a semiconductor substrate, and salicided peripheral devices, located in a first region of said semiconductor substrate, with said flash memory cell featuring SAC structures, located, and self-aligned, between stack gate structures, and contacting underlying source/drain regions, comprising the steps of:

forming isolation regions in said semiconductor substrate;

forming a silicon dioxide gate insulator layer, on said first region of said semiconductor substrate, used for said peripheral devices;

forming an intrinsic, first polysilicon layer, on said silicon dioxide gate insulator layer, wherein said first polysilicon layer is obtained via LPCVD procedures at a thickness between about 1500 to 3000 Angstroms;

forming a silicon dioxide, tunnel oxide layer, on said second region of said semiconductor substrate, used for said flash memory cell;

depositing a second polysilicon layer;

patterning of said second polysilicon layer, to form a polysilicon floating gate shape on said silicon dioxide, tunnel oxide layer, in said second region of said semiconductor substrate;

forming a first ONO, (Oxidized silicon Nitride on Oxide), layer;

depositing a third polysilicon layer, on said first ONO layer, wherein said third polysilicon layer is obtained via LPCVD procedures to a thickness between about 1000 to 2000 Angstroms, and doped in situ, during deposition, via the addition of arsine, or phosphine, to a silane ambient;

depositing a tungsten silicide layer on said third polysilicon layer;

forming a second ONO layer on said tungsten silicide layer;

patterning of said second ONO layer, of said tungsten silicide layer, of said third polysilicon layer, of said first ONO layer, and of said polysilicon floating gate shape, to create said stacked gate structures, in said second region of said semiconductor substrate, with each stacked gate structure comprised of said second ONO second shape, a polycide shape, used for the control gate of said flash memory cell, comprised of a tungsten silicide shape overlying a third polysilicon shape, a first ONO shape, and said polysilicon floating gate shape, on said silicon dioxide tunnel oxide layer, while said patterning procedure completely removes said second ONO layer, said polycide layer, and said first ONO layer, from the surface of said silicon dioxide tunnel oxide layer, overlying first polysilicon layer, in said first region of said semiconductor substrate;

forming a medium doped source/drain region, in an area of said second region of said semiconductor substrate, not covered by said stacked gate structures;

patterning of said silicon oxide tunnel oxide layer, and of said first polysilicon layer, to create polysilicon gate structures, on said silicon dioxide gate insulator layer, in said first region of said semiconductor substrate;

forming a lightly doped source/drain region, in an area of said first region of said semiconductor substrate, not covered by said polysilicon gate structures;

forming a double diffused source/drain region, in an area of said second region of said semiconductor substrate, not covered by said stacked gate structures, wherein said double diffused source/drain region is formed via ion implantation of phosphorous or arsenic ions, at an energy between about 30 to 70 KeV, at a dose between about 5E13 to 5E14 atoms/cm$^2$, and where said double diffused source/drain region is sometimes only formed at the cell drain side;

forming silicon nitride spacers on the sides of said stack gate structures, and on the sides of said polysilicon gate structures;

forming a heavily doped source/region, in an area of said first region of said semiconductor substrate, not covered by said polysilicon gate structures, or by said silicon nitride spacers, and in an area of said second region of said semiconductor substrate, not covered by said stacked gate structures, of by said silicon nitride spacers;

removing said silicon dioxide tunnel oxide layer, from the top surface of said polysilicon gate structure;

selectively forming titanium salicide layers on said heavily doped source/drain regions, and on the top surface of said polysilicon gate structure, in said first region, and in said second region, of said semiconductor substrate, wherein said titanium salicide layer is formed via R.F. deposition of a titanium layer, at a thickness between about 200 to 500 Angstroms, followed by an anneal procedure performed using RTA or conventional furnace procedures, at a temperature between about 650 to 800° C., with unreacted portions of the titanium layer removed in a solution containing $H_2O_2$—HCl—$NH_4OH$—$H_2O$, at a temperature between about 25 to 100° C.;

depositing an interlevel dielectric layer, completely filling the spaces between said stack gate structures;

forming SAC openings in said interlevel dielectric layer, and in said protective insulator layer, exposing a portion of said stacked gate structures, and exposing said double diffused source/drain region, located between said stack gate structures, in said second region of said semiconductor substrate, and forming contact hole openings, in said interlevel dielectric layer, exposing said titanium salicide layer, on said heavily doped source/drain regions, in said first region, and in said second region, of said semiconductor substrate;

depositing a conductive layer;

removal of said conductive layer, from the top surface of said interlevel dielectric layer, creating conductive SAC structures, in said SAC openings, contacting said double diffused source/drain regions, in said second region of said semiconductor substrate, while creating conductive plug structures, in said contact hole openings, contacting said titanium salicide layer, on said heavily doped source/drain regions, in said first region of said semiconductor substrate;

depositing a metal layer; and patterning of said metal layer to form metal interconnect structures.

18. The method of claim 17, wherein said silicon dioxide gate insulator layer, is obtained via thermal oxidation procedures, at a thickness between about 20 to 250 Angstroms.

19. The method of claim 17, wherein said silicon dioxide tunnel oxide layer is thermally grown, in an oxygen-steam ambient, at a temperature between about 800 to 1000° C., to a thickness between about 80 to 120 Angstroms.

20. The method of claim 17, wherein said second polysilicon layer is deposited using LPCVD procedures, to a thickness between about 700 to 1500 Angstroms, and doped in situ, during deposition, via the addition of arsine, or phosphine, to a silane ambient.

21. The method of claim 17, wherein said floating gate shape is patterned via an anisotropic RIE procedure, performed to said second polysilicon layer, using $Cl_2$ as an etchant.

22. The method of claim 17, wherein said first ONO layer, and said second ONO layer, are comprised of an oxidized silicon nitride layer on oxide, at an equivalent silicon oxide thickness between about 100 to 300 Angstroms, and where the silicon nitride layer is obtained via LPCVD or PECVD procedures, at a thickness between about 50 to 150 Angstroms, and completely oxidized in an oxygen-steam ambient.

23. The method of claim 17, wherein said tungsten silicide layer is obtained via LPCVD procedures, to a thickness between about 1000 to 2000 Angstroms, using silane and tungsten hexafluoride as reactants.

24. The method of claim 17, wherein said stack gate structures are formed via an anisotropic RIE procedure, using $CHF_3$ as an etchant for said second ONO layer, and for said first ONO layer, while using $Cl_2$ as an etchant for said tungsten silicide layer, for said third polysilicon layer, and for said polysilicon floating gate shape.

25. The method of claim 17, wherein said silicon nitride spacers are formed from a layer of silicon nitride, obtained via LPCVD or PECVD procedures, at a thickness between about 1000 to 2500 Angstroms, followed by anisotropic etching, using $CF_4$ as an etchant.

26. The method of claim 17, wherein said heavily doped source/drain region, in said first region, and in said second region, of said semiconductor substrate, is formed via ion implantation of arsenic or phosphorous ions, at an energy between about 5 to 60 KeV, at a dose between about 1E15 to 8E15 atoms/cm$^2$.

27. The method of claim 17, wherein said interlevel dielectric layer is a silicon oxide layer, obtained via LPCVD or PECVD procedures, at a thickness between about 8000 to 15000 Angstroms.

28. The method of claim 17, wherein said SAC openings, in said interlevel dielectric layer, and said contact hole openings, in said interlevel dielectric layer, are formed via an anisotropic RIE procedure, using $CHF_3$ as an etchant.

29. The method of claim 17, wherein said conductive SAC structures, in said SAC openings, and said conductive plug structures, in said contact hole openings, are comprised of either tungsten, or doped polysilicon.

* * * * *

UNITED STATES PATENT AND TRADEMARK OFFICE
CERTIFICATE OF CORRECTION

PATENT NO.    : 6,133,096
DATED         : October 17, 2000
INVENTOR(S)   : Hung-Der Su, Jong Chen, Chrong-Jung Lin, Di-Son Kuo It is certified that error appears in the above-identified patent and that said Letters Patent is hereby corrected as shown below:

Title page,
Item [54], please correct the word "Periphereral" in the Title so that the Title reads -- Process for Simultaneously Fabricating a Stack Gate Flash Memory Cell and Salicided Peripheral Devices --

Item [76], Inventors, the list should read -- Hung-Der Su, Kao-Hsiung, Taiwan; Jong Chen, Taipei, Taiwan; Chrong-Jung Lin, Taipei, Taiwan; Di-Son Kuo, Hsin-Chu, Taiwan --

Please add the Assignee: Taiwan Semiconductor Manufacturing Company, Hsin-Chu, Taiwan Signed and Sealed this First Day of January, 2002

Attest:

JAMES E. ROGAN
*Attesting Officer*    *Director of the United States Patent and Trademark Office*